US 11,391,763 B2

(12) United States Patent
Lamesch et al.

(10) Patent No.: US 11,391,763 B2
(45) Date of Patent: Jul. 19, 2022

(54) SYSTEM FOR GROUNDING AND DIAGNOSTICS

(71) Applicant: IEE INTERNATIONAL ELECTRONICS & ENGINEERING S.A., Echternach (LU)

(72) Inventors: Laurent Lamesch, Reichlange (LU); Michael Puetz, Trier (DE)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 0 days.

(21) Appl. No.: 16/970,883

(22) PCT Filed: Feb. 19, 2019

(86) PCT No.: PCT/EP2019/054083
§ 371 (c)(1),
(2) Date: Aug. 18, 2020

(87) PCT Pub. No.: WO2019/162267
PCT Pub. Date: Aug. 29, 2019

(65) Prior Publication Data
US 2020/0379056 A1    Dec. 3, 2020

(30) Foreign Application Priority Data

Feb. 20, 2018 (LU) .......................................... 100707
Mar. 27, 2018 (LU) .......................................... 100745

(51) Int. Cl.
*G01D 5/24* (2006.01)
*G01R 27/02* (2006.01)
(Continued)

(52) U.S. Cl.
CPC ............... *G01R 27/02* (2013.01); *G01D 5/24* (2013.01); *G01R 31/52* (2020.01); *G01R 31/54* (2020.01);
(Continued)

(58) Field of Classification Search
CPC ........ G01R 31/54; G01R 31/52; G01R 27/02; G01D 5/24; H03K 17/955
See application file for complete search history.

(56) References Cited

U.S. PATENT DOCUMENTS 6,392,542 B1 *  5/2002  Stanley .................. B60N 2/002
                                                        280/735
6,707,306 B1    3/2004  Wendt
(Continued)

FOREIGN PATENT DOCUMENTS

EP       1112502 A1       7/2001
WO    WO199959003 A1    11/1999
(Continued)

OTHER PUBLICATIONS

International Search Report corresponding to International Application No. PCT/EP2019/054083, dated Mar. 28, 2019, 3 pages.
(Continued)

*Primary Examiner* — Alesa Allgood
(74) *Attorney, Agent, or Firm* — Reising Ethington P.C.

(57) ABSTRACT

A system for grounding and diagnostics, including a conductive frame for mounting a capacitive sensor. In order to provide a means for ensuring and monitoring a grounded condition of a conductive frame, the system further includes a diagnostics circuit, by which the frame is AC grounded and which has an electric source connected to the frame via a first line and adapted to apply a diagnose signal to the frame via the first line, the diagnostics circuit being connected to the frame by a second line and being adapted to provide at
(Continued)

least one quantity that depends on the diagnose signal and on a ground connection of the frame.

16 Claims, 4 Drawing Sheets

(51) Int. Cl.
    *G01R 31/52*      (2020.01)
    *H03K 17/955*      (2006.01)
    *G01R 31/54*      (2020.01)

(52) U.S. Cl.
    CPC ............... *H03K 17/955* (2013.01); *H03K 2217/960705* (2013.01)

(56) References Cited

U.S. PATENT DOCUMENTS

| | | | |
|---|---|---|---|
| 2015/0367751 A1* | 12/2015 | Lamesch | B60N 2/56 297/180.12 |
| 2018/0037137 A1* | 2/2018 | Goedert | G01R 27/26 |

FOREIGN PATENT DOCUMENTS

| | | |
|---|---|---|
| WO | WO2000048010 A1 | 8/2000 |
| WO | WO2014122197 A1 | 8/2014 |

OTHER PUBLICATIONS

Written Opinion corresponding to International Application No. PCT/EP2019/054083, dated Mar. 28, 2019, 9 pages.

\* cited by examiner

SYSTEM FOR GROUNDING AND DIAGNOSTICS

TECHNICAL FIELD

The invention relates to a system for grounding and diagnostics and to a diagnostics circuit, e.g. to be used in conjunction with a capacitive sensor.

BACKGROUND

Capacitive sensors today are used for a vast variety of applications, like input devices (e.g. touchpads, capacitive sliders, touch wheels, etc.), proximity sensors or occupant detection systems.

There are many different types of capacitive sensors known in the art, but most of them rely on the following principle. A sensing electrode is disposed so that an approaching object (person, hand, finger or the like) changes the capacitance of the sensing electrode with respect to ground. The object of may also account for dielectric losses, wherefore the sensing electrode in general has an impedance with a resistance and a reactance, both of which may be influenced by the object. The changing impedance is measured by a measurement circuit. For instance, the sensing electrode may be connected to an alternating voltage, e.g. a square wave voltage, and the current through the electrode, which depends on its impedance, can be converted by the measurement circuit into a voltage. This voltage is indicative of the impedance and thus may be used to determine whether an object is near the sensing electrode.

In many applications, the sensing electrode is mounted on a conducting structure, which may be referred to as a frame. For instance, in occupant detection systems, the sensing electrode is normally disposed within the vehicle seat. In general, an electric field is formed between the sensing electrode and the metal components of the vehicle seat, which may be referred to as the seat frame. Therefore, the impedance on the one hand depends on the proximity of an object, but also on the grounded condition of the seat frame, i.e. whether the seat frame properly connected to ground (i.e. the vehicle body) or not (i.e. has a floating potential). While it is possible to successfully detect an object even if the seat frame is not grounded, the capacitive sensor has to be calibrated for a certain condition of the seat frame (grounded or not grounded), which afterwards has to be maintained during the operation of the capacitive sensor. If the condition changes, this can lead to false detections or non-detections, respectively. Since occupant detection systems are mostly connected to safety-relevant systems like seatbelt reminders, airbags and the like, malfunctions of the capacitive sensor should be minimized or avoided.

SUMMARY

It is thus an object of the present invention to provide means for ensuring and monitoring a grounded condition of a conductive frame.

This problem may be solved by a system and diagnostics circuit according to the claims.

In one aspect, the invention provides a system for grounding and diagnostics. In this context, "grounding" refers to applying, establishing and/or maintaining a connection to ground.

The system comprises a conductive frame for mounting a capacitive sensor. The frame is for mounting a capacitive sensor, i.e. in operational state, a capacitive sensor is directly or (usually) indirectly mounted on the conductive frame. More specifically, although the capacitive sensor is mounted on the frame, any sensing electrode of the capacitive sensor is physically distinct and usually electrically isolated from the frame (although some current flow between a sensing electrode and the frame may be inevitable). The frame, which normally is made of metal, may in particular be a vehicle seat frame on which one or several capacitive sensors of an occupant detection system can be mounted or it may be a steering wheel rim of a steering wheel on which at least one sensor for hand detection is mounted. Either way, since the capacitive sensor is to be mounted on the conductive frame, the capacitance and the impedance of the capacitive sensor are influenced by the presence of the frame. In particular, the impedance depends on whether the frame is grounded not.

The system further comprises a diagnostics circuit, by which the frame is AC grounded and which comprises an electric source connected to the frame via a first line and adapted to apply diagnose signal to the frame via the first line, the diagnostics circuit being adapted to provide at least one quantity that depends on the diagnose signal and that enables diagnostics of a grounded condition of the frame. Here and in the following, "AC grounded" means connected to ground so that an alternating current can flow between ground and the AC grounded element. The frame is AC grounded by the diagnostics circuit, which implies that the diagnostics circuit itself has to be AC grounded. As the frame is AC grounded, it has a well-defined electric potential, wherefore any detrimental effect on measurements by the capacitive sensor can be avoided. Here and in the following, "connected" refers to either a direct connection or an indirect connection via at least one intermediate element.

However, correct operation of the capacitive sensor depends on whether the grounded condition of the frame can be maintained. Therefore, the diagnostics circuit is also adapted for diagnostics of the grounded condition. It comprises a electric source, which is connected to the frame via a first line. The first line can be any kind of conductor, like a conductor path on a printed circuit board, a wire or the like. The electric source may be connected directly or indirectly, i.e. via at least one intermediate element, to the first line. In general, the first line has a wiring resistance, which possibly cannot be neglected. The electric source, which may be any kind of voltage source or current source, optionally in combination with other elements, is adapted to generate and apply a diagnose signal to the frame via the first line. The diagnose signal may be an AC signal or a DC signal. In general, the "response" to the diagnose signal depends on whether the frame is grounded and if so, how it is grounded. For instance, the response may depend on an external ground connection of the frame and on the integrity of the AC connection to ground via the diagnostics circuit. As will be explained below, the diagnostics circuit may comprise more than one electric source, wherefore the electric source may also be referred to as a "first" electric source. For sake of brevity, it is mostly referred to as the electric source.

The diagnostics circuit is connected to the frame by a second line. Although reference is made to a single diagnostics circuit, those parts of the diagnostics circuit that are connected to the first line and those parts that are connected to the second line are usually only connected with each other via the frame, i.e. there are normally no electric connections between these two parts within the diagnostics circuit itself. However, some connections may be present to transmit control signals in order to coordinate the functions of elements connected to the first line and the second line, respectively. By the presence of the second line, the diagnostics circuit has (at least) two connections to the frame. As will become apparent below, this "two-wire" approach (which may also be referred to as two-wire diagnostics) has decisive advantages. For example, it is possible that a diagnose signal or a part of such a signal is sent through the first line into the frame and from there through the second line back, into the diagnose circuit. Also, the second line may be used to apply a (second) diagnose signal to the frame. Either way, the diagnostics options and/or the accuracy of the diagnostics are enhanced.

The diagnostics circuit is adapted to provide at least one quantity that depends on the diagnose signal and on a ground connection of the frame. Herein, "providing" the quantity may in particular refer to measuring the quantity or outputting the quantity for measurement by another device. The at least one quantity is normally a voltage or a current. It may be considered as a response to the diagnose signal, wherefore it depends on the diagnose signal, e.g. on an amplitude and/or a frequency of the diagnose signal. Also, the at least one quantity is influenced by a ground connection of the frame, e.g. an external ground connection and/or the (AC) ground connection via the diagnostics circuit. Therefore, by measuring the respective quantity, it is possible to perform diagnostics of the ground connection.

While reference is made to "a" diagnose signal, the parameters of the diagnose signal may be changed over time and/or it may be temporarily interrupted. In such cases, the diagnose signal could also be considered as a sequence of signals. As also indicated, the diagnose signal applied via the first line may in some embodiments be referred to as a first diagnose signal, e.g. if a second diagnose signal is applied via the second line. Since the function of the diagnostics circuit is to enable diagnostics of the ground connection, it is adapted to apply the diagnose signal (or at least the first diagnose signal) independently of a sensing operation of the capacitive sensor. This includes the possibility that the diagnose signal may be applied simultaneously with the sensing operation.

Preferably, the frame is AC grounded via at least one of the first line and the second line. In other words, a connection between the frame and AC ground is provided—either directly or indirectly—via at least one of the first line and the second line. One option is that the frame is AC grounded only via the first line. Another option is that the frame is AC grounded only via the second line. A third option is that the frame is AC grounded via both the first line and the second line. This can e.g. be useful for redundancy reasons.

According to one embodiment, the diagnostics circuit is adapted to provide at least one quantity that enables determination of at least one of a ground impedance or a ground shift voltage that the frame has with respect to ground. In general, the relation of the frame to ground may be described by a ground impedance and/or a ground shift voltage. The ground impedance is the impedance between the frame and ground, which may comprise a resistance and a reactance, due to resistive, capacitive and/or inductive effects. If the frame is connected to ground, the ground impedance and the ground shift voltage are characteristic of an external ground connection. The ground shift voltage represents a voltage shift between the frame (or a structure to which the frame is connected) and ground. Referring to a vehicle seat or a steering wheel, a non-zero ground shift voltage may be due to currents flowing through the grounding connections, which have a non-negligible impedance. It should be noted that depending on the respective situation, the ground impedance and/or the ground shift voltage may be negligible or zero. In a case where there the frame has no external ground connection, the ground shift voltage is undefined and the ground impedance may be purely capacitive (typically below 200 µF). By providing the abovementioned quantity, which can be measured by the diagnostics circuit itself or by another device, at least a partial diagnostics of the relation of the frame to ground is possible. For instance, if the ground shift voltage is determined, this may be used to determine an external influence on the diagnostics or to identify a short circuit between the frame and a voltage source like the car battery. In a situation where the frame is supposed to be electrically isolated from ground and therefore should have a floating potential, an unwanted connection to ground can be detected. Also, if the ground impedance is determined, this may be used to identify a defect in the external ground connection, e.g. an open circuit or the like. There are several different ways how the ground impedance or the ground shift voltage can be determined. One example is to apply a voltage signal or a current signal as the diagnose signal and to detect a voltage at a specific point within the diagnostics circuit. This voltage depends on the diagnose signal itself, impedances within the diagnostics circuit, the ground impedance and the ground shift voltage. By sequentially applying two DC signals and measuring the voltage, the ground impedance as well as the ground shift voltage can be calculated (strictly speaking, this is an approximation, which is valid, though, if the wiring resistance of the first line—plus, where applicable, that of the second line—can be neglected). Likewise, a single AC signal may be applied, which allows to determine the ground impedance, assuming that the ground shift voltage has no frequency component having the same frequency as the AC signal.

The electric source may be a first voltage source. The first voltage source may be an AC voltage source adapted to apply an AC voltage as the diagnose signal or a DC voltage source adapted to apply a DC voltage. Alternatively, the electric source may be a current source. It may either be an AC current source adapted to apply an AC current as the diagnose signal or it may be a DC current source adapted to apply a DC current as the diagnose signal. If the electric source is an AC voltage source or AC current source, it is preferred that it is adapted to provide a frequency that is different from a measurement frequency used to operate the capacitive sensor. If present, the upper harmonics of the two signals should also be different. However, in general it may be sufficient if there is no significant correlation between the diagnose signal and the signal used for measurement, e.g. one may be sinusoidal while the other is a pseudo-random phase shift keyed signal. The same criterion applies to any AC current sources or AC voltage sources mentioned below. As long as the frequencies are different as described, measurement operation of the capacitive sensor and operation of the diagnostics circuit may be performed simultaneously. Otherwise, operation of the capacitive sensor needs to be interrupted while the diagnostics circuit is in operation.

In particular, but not exclusively, when the electric source is a first voltage source, it may be connected to the first line via a first impedance element. The first impedance element can be any element or circuit that has a non-zero or non-negligible impedance. In general, it may be a resistive, capacitive or inductive element or a combination of these, e.g. a parallel connection and/or series connection. If the first voltage source is a DC voltage source, the first impedance element is preferably a resistive element (e.g. a resistor). If the first voltage source is an AC voltage source, the first impedance element is preferably a capacitive element (e.g. a capacitor) or a combination of a capacitive element and a resistive element. It is understood that the first impedance element gives rise to a voltage drop if a current flows through it. The voltage drop is characteristic of the current and, for a given voltage of the first voltage source, the current in turn is characteristic of the total impedance to which the voltage is applied (and possibly other voltages, e.g. the above-mentioned ground shift voltage). Therefore, it is possible to deduce characteristics like the ground shift voltage and the ground impedance from the voltage drop at the first impedance element. If the electric source is a current source, the first impedance element may be omitted. The current applied by the current source in general leads to a voltage drop at each element it flows through. For instance, the ground impedance leads to a voltage drop that, in turn, has an influence on the voltage at a specific point within the diagnostics circuit. This voltage may also be influenced by a non-zero ground shift voltage. Therefore, a voltage measurement (or several measurements) within the diagnostics circuit may be used to identify the ground impedance and/or the ground shift voltage.

The electric source may be connected to the first line via a first node, which is AC grounded. In general, the first node is only a reference point along an electric connection between the electric source and the first line. However, apart from being connected to the first line and the electric source, the first node has a connection to ground via a capacitive element (e.g. a capacitor), i.e. it is AC grounded. This may be realised by a conductor branching off a connection between the electric source and the first line. In this embodiment, at least one (and possibly the only) AC ground connection of the diagnostics circuit is realised via the first node. It is understood that if the diagnose signal is an AC signal, an electric current flows through the first node and the above-mentioned capacitive element to ground. If the diagnose signal is a DC signal, no current should flow through the first node and the capacitive element to ground. If, however, a significant direct current flow is detected, this can be attributed to a short circuit or some defect of the capacitive element. If the diagnostics circuit comprises the first impedance element, the first impedance element is connected between the electric source and the first node.

Preferably, the diagnostics circuit is adapted to provide a first voltage of a first output, which is connected to the first node. The first output may, for example, be connected to an input of a microcontroller or similar measurement device that is adapted to measure the first voltage, evaluate the result, e.g. by comparison with predefined threshold values, and optionally output an error signal or warning signal. The measurement device may be part of the diagnostics circuit or may be external to the diagnostics circuit.

According to one preferred embodiment, a second impedance element is connected between the first node and the first line. In other words, the first node is connected to the first line (and thus to the frame) via the second impedance element. Like the first impedance element, the second impedance element can be any element or circuit that has a non-zero or non-negligible impedance. It may be a resistive, capacitive or inductive element or a combination of these, e.g. a parallel connection and/or series connection. If the diagnose signal is a DC signal, the second impedance element is preferably a resistive element (e.g. a resistor) or a parallel connection of a resistive element and a capacitive element. If the diagnose signal is an AC signal, the second impedance element may be a capacitive element (e.g. a capacitor). In case of a DC signal, the presence of such a second impedance element may be employed to detect a short circuit between the first node and ground. Under normal conditions, the total resistance encountered by the first signal should be greater than the resistance of the second impedance element. However, when there is an unwanted DC connection between the first node and ground, the total resistance may drop to a value below the resistance of the second impedance element. This, in turn, can be detected e.g. by measuring the first voltage at the first output.

Preferably, the second line is connected to a second node, which is at least AC grounded. In other words, the diagnostics circuit can be AC grounded at the second node, either exclusively or in addition to the first node being AC grounded, so that the frame can be AC grounded via the second node and, optionally, via the first node. It may be advantageous to have an AC ground connection at both the first node and the second node to provide some redundancy. As the diagnose signal is applied by the electric source, at least a part of the corresponding signal flows through the first line, the frame and the second line to the second node and from there to ground. The second node is at least AC grounded, which includes the possibility that it is also DC grounded. The latter configuration is in particular preferred if the diagnose signal is a DC signal. Such a DC ground connection may be realised by a resistive element alone or by a parallel connection of a capacitive element and a resistive element.

According to one embodiment, the diagnostics circuit is adapted to measure a difference between the first voltage and a second voltage of a second output connected to the second node. Since the first node and the second node are connected via the first line, the frame and the second line, the first and second line and the frame can be assumed to be intact if the difference between the first and second voltage is below a certain threshold. Therefore, the integrity of the first and second line and the frame can be verified by a single measurement. In this context, the electric source may be a voltage source or a current source as described above and the diagnose signal may be an AC signal or a DC signal.

In some embodiments, the first output is directly connected to the first node. In other embodiments, the first output is connected to the first node via a third impedance element. This may e.g. be the case when no DC current is allowed to flow through the frame. This means that no DC path may be open between the frame and ground. Therefore the first, second and/or third impedance element have to be chosen so that no such DC path is open. Since one possibility for such a DC path would be through the first line, the first node and the first output, either the second impedance element (if present) or the third impedance element has to comprise a capacitance that is only permeable for AC signals.

In addition to the abovementioned (first) electric source, the diagnostics circuit may comprise a second electric source which is connected to the frame via the second line. The second line may be connected directly or indirectly to the second electric source. The second electric source may be a voltage source or a current source. It may be adapted to apply a diagnose signal to the frame via the second line. The diagnose signal applied via the first line may be referred to as a "first diagnose signal" and the diagnose signal applied via the second line may be referred to as a "second diagnose signal", in particular if only one of the first electric source and the second electric source is activated at a time. In this case, the first diagnose signal and the second diagnose signal are applied sequentially. However, they could also be regarded as a single diagnose signal that is temporarily applied via the first line and the second line, respectively. However, the first electric source and the second electric source may also be activated simultaneously, whereby the diagnose signal applied to the frame could be regarded as a superposition of the first diagnose signal and the second diagnose signal.

According to one embodiment, the electric source comprises a first transimpedance amplifier, having a reference input connected to a second voltage source and a signal input connected to the first node. By the characteristics of the transimpedance amplifier, the voltage at signal input follows the voltage at the reference input, which is defined by the second voltage source. The transimpedance amplifier also has an output where a voltage is provided that is proportional to the current flowing through the signal input. If, for instance, a connection between the frame and the first node via the first line is defective, the current through the signal input becomes negligible and thus also the voltage at the output. The signal input may be connected to the first node via the first impedance element. Further, first node is preferably connected to the first line via the second impedance element and is connected to the first output via the third impedance element. The first, second and third impedance element are preferably chosen so that no DC path exists between the frame and ground. In combination with the above-mentioned transimpedance amplifier, it is preferred that the second line is AC grounded, i.e. connected to ground via a capacitive element. It may be connected to the above-mentioned second node, which is AC grounded. According to another embodiment, the second line is connected to a third voltage source via a capacitance element. One might also say that the second line is capacitively coupled or AC coupled to the third voltage source. In other words, in this embodiment, the second electric source is the third voltage source. It is understood that the third voltage source is an alternating voltage source. The third voltage source could be a guard voltage source of a measurement circuit of the capacitive sensor and the capacitance element could be the capacitance between the corresponding guard electrode and the frame. The diagnostics circuit may be adapted to, in a first step, activate the third voltage source and deactivate the second voltage source, and, in a second step, activate the second voltage source. In the first step, a current is supposed to flow into the signal input of the transimpedance amplifier. If, however, the connection between the third voltage source and the signal input is damaged, the current may become negligible. However, such a negligible current could also be due to the ground impedance being very low, wherefore the current originating from the third voltage source almost entirely flows through the ground impedance to ground. However, in the second step, the third voltage source is deactivated and by activating the second voltage source, the voltage at the signal input follows the voltage at the reference input. Under these circumstances, a non-negligible current flows through the signal input unless the connection between the signal input and the frame is interrupted. The voltage applied to the frame by the third voltage source may also be regarded as a second diagnose signal.

According to one embodiment, the diagnostics circuit may comprise two transimpedance amplifiers. More specifically, the diagnostics circuit comprises (in addition to the first transimpedance amplifier) a second transimpedance amplifier having a reference input connected to a fourth voltage source and a signal input connected to a third node that is AC grounded and connected to the second line, while the diagnostics circuit is adapted to provide (and optionally measure) a third voltage of a third output connected to the third node. In this embodiment, the second electric source comprises the second transimpedance amplifier and the fourth voltage source. A signal applied to the frame by the second electric source may also be regarded as a second diagnose signal. In particular, the diagnostics circuit may comprise two parts that are similar or even identical in setup. Thus, the reference input of the first transimpedance amplifier may be connected to the second voltage source while its signal input is connected to the first node via the first impedance element, while the first node in turn is connected to the first line via the second impedance element and to the first output via the third impedance element. Similarly, the reference input of the second transimpedance amplifier may be connected to the fourth voltage source while its signal input is connected to the third node via a fourth impedance element, while the third node in turn is connected to the second line via a fifth impedance element and to the third output via the sixth impedance element. The first to sixth impedance elements are preferably adapted to provide an AC only path between the frame and ground.

This embodiment allows for an exact measurement of the respective resistances of the first line and the second line as well as the ground impedance, e.g. by applying methods described in WO 1999/059003 A1 and WO 2000/048010 A1. Referring to FIG. 1 in WO 2000/048010 A1, for example, the voltage sources 100 and 101 are equivalent to the first and second voltage source in this embodiment. In the present case, currents are measured with the first and second transimpedance amplifier. While in WO 2000/048010 A1, three capacitances are calculated, the same principle can be applied to calculating the ground impedance, the resistance of the first line (plus the impedance of the first impedance element and of the second impedance element, where applicable) and the resistance of the second line (plus the impedance of the fourth impedance element and of the fifth impedance element, where applicable). Thus, an equation system similar to the one shown in WO 2000/048010 A1, which is based on network analysis and Kirchhoff's rules, can be applied. Since the impedances of the first, second, fourth and fifth impedance element are known, these can be eliminated to calculate the wiring resistances of the first and second line. Applying the principles of WO 1999/059003 A1 to the present case, the first and second voltage sources apply two signals of same frequency but opposite polarity. The amplitude is adjusted so that the currents are the same (with opposite polarity) and no current flows from the frame to ground.

In another aspect, the invention provides a diagnostics circuit for a conductive frame for mounting a capacitive sensor, wherein the diagnostic circuit is adapted for AC grounding the frame and comprises an electric source adapted for being connected to the frame via a first line and to apply a diagnose signal to the frame via the first line, the diagnostics circuit being adapted to be connected to the frame via a second line and being adapted to provide at least one quantity that depends on the diagnose signal and on a ground connection of the frame. All these terms have been explained above with respect to the inventive system and therefore will not be explained again.

Preferred embodiments of the inventive diagnostics circuit correspond to those of the inventive system.

BRIEF DESCRIPTION OF THE DRAWINGS

Further details and advantages of the present invention will be apparent from the following detailed description of not limiting embodiments with reference to the attached drawing, wherein.

DETAILED DESCRIPTION

Figure 1:
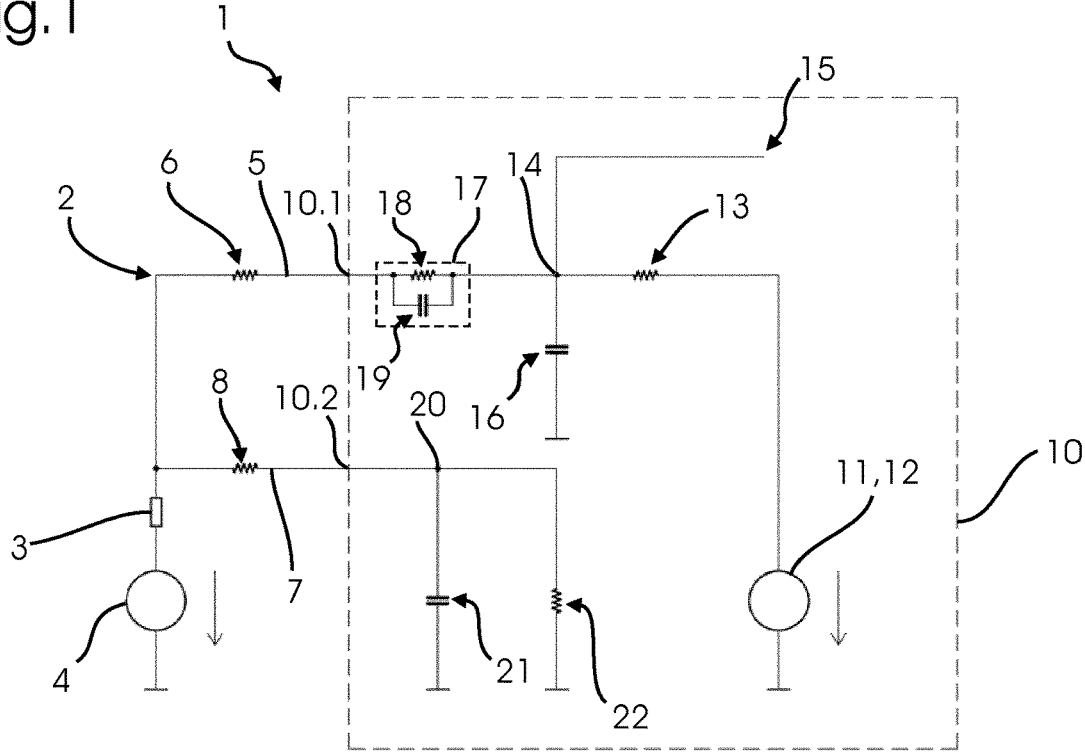
FIG. 1 is a schematic view of a first embodiment of an inventive system.

FIG. 1 shows a first embodiment of an inventive system 1 for grounding and diagnostics, which may be used in connection with an occupant detection system or a hands-on detection system in a vehicle. It comprises a frame 2 (represented by a frame node), which can be a seat frame or a steering wheel rim, respectively, and a diagnostics circuit 10. The frame 2, on which a capacitive sensor (not shown) is to be mounted, has an external ground connection characterized by a ground impedance 3 and a ground shift voltage 4. The ground impedance 3 is the impedance between the frame 2 and ground, and can be resistive, capacitive, and/or inductive. The ground shift voltage 4 is present inside the wiring of a vehicle due to currents flowing through the grounding connections which have a non-negligible impedance.

The frame 2 is connected to the diagnostics circuit 10 via a first line 5 having a first wiring resistance 6 and being connected to a first circuit port 10.1 and via a second line 7 having a second wiring resistance 8 and being connected to a second circuit port 10.2. The diagnostics circuit 10 is adapted for a situation where a DC current may be injected into the frame 2, which is not always allowed or possible, and where the external ground connection is undefined (i.e. present, absent or not known).

A first electric source 11, which in this case is a first voltage source 12, is connected via a first impedance element 13, in this case a resistor, to a first node 14, which is AC grounded via a first capacitor 16. The first node 14 is also connected to a first output 15 and is connected to the first line 5 via a second impedance element 17, which in this case is a parallel connection of a first resistor 18 and a second capacitor 19. The first output 15 may be connected to an ADC input of a micro controller (which is not shown here). The second line 7 is connected to a second node 20, which is AC grounded via a third capacitor 21 and DC grounded via a second resistor 22. In this embodiment, the frame 2 is AC grounded via first and second capacitors 16, 19 as well as via third capacitor 21 whereby a redundant AC grounding is provided. It would be possible to omit e.g. first and second capacitors 16, 19. The first voltage source 12 may be an AC voltage source or a DC voltage source. The resistors 18, 22 may be omitted if it is an AC voltage source.

In order to perform diagnostics, the first voltage source 12 applies an diagnose signal with at least two different DC voltage levels. For each of these voltage levels, the voltage at the first output 15 is measured (either by the diagnostics circuit 10 or by some external measurement device). This voltage is defined by the known voltage level of the first voltage source 12, the first and second impedance element 13, 17, the unknown first and second wiring resistance 6, 8, the ground impedance 3 and the unknown ground shift voltage 4. By evaluating the results of the two measurements, the equivalent source voltage and equivalent source resistance of a series connected voltage source and resistance (Thévenin equivalent circuit) connected between ground and the first circuit port 10.1 can be calculated. The calculated source resistance comprises a contribution from the first wiring resistance 6, whereby the remaining resistance between the frame 2 and ground must be smaller than the calculated source resistance. The calculated source voltage can in addition be used to diagnose a short circuit between the first circuit port 10.1 or the frame 2 and an external voltage source which has a larger voltage level than the ground shift voltage 4, for example battery voltage.

Measurement of the voltage at the first output 15 also allows to determine a total impedance and a total resistance. To this respect, the first resistor 18 allows to detect a short circuit between the first node 14 and ground, as the total measured resistance must always be higher than the resistance of the first resistor 18.

Alternatively, the first voltage source 12 can also supply an AC voltage signal. Preferably, the frequency of the AC voltage signal is different from the measurement frequency of the capacitive measurement system (and preferably their respective harmonics are different). In general, it may be sufficient if there is no significant correlation between the diagnose signal and the signal used for measurement. This allows the parallel operation of the capacitive measurement system and the diagnostics circuit 10 without creating a disturbance between the two. If the two frequencies are the same, both measurements have to be performed alternatingly. Similar requirements apply to other AC voltage sources and AC current sources referred to below.

By generating an AC signal of known characteristics, the influence of the ground shift voltage 4 on the diagnostics measurement result is eliminated, provided that there is no correlation between the signals generated by first voltage source 12 and the ground shift voltage 4. In order to measure the equivalent source resistance above, only one AC voltage level generated by the first voltage source 12 and one measurement on output 15 is sufficient.

Figure 2:
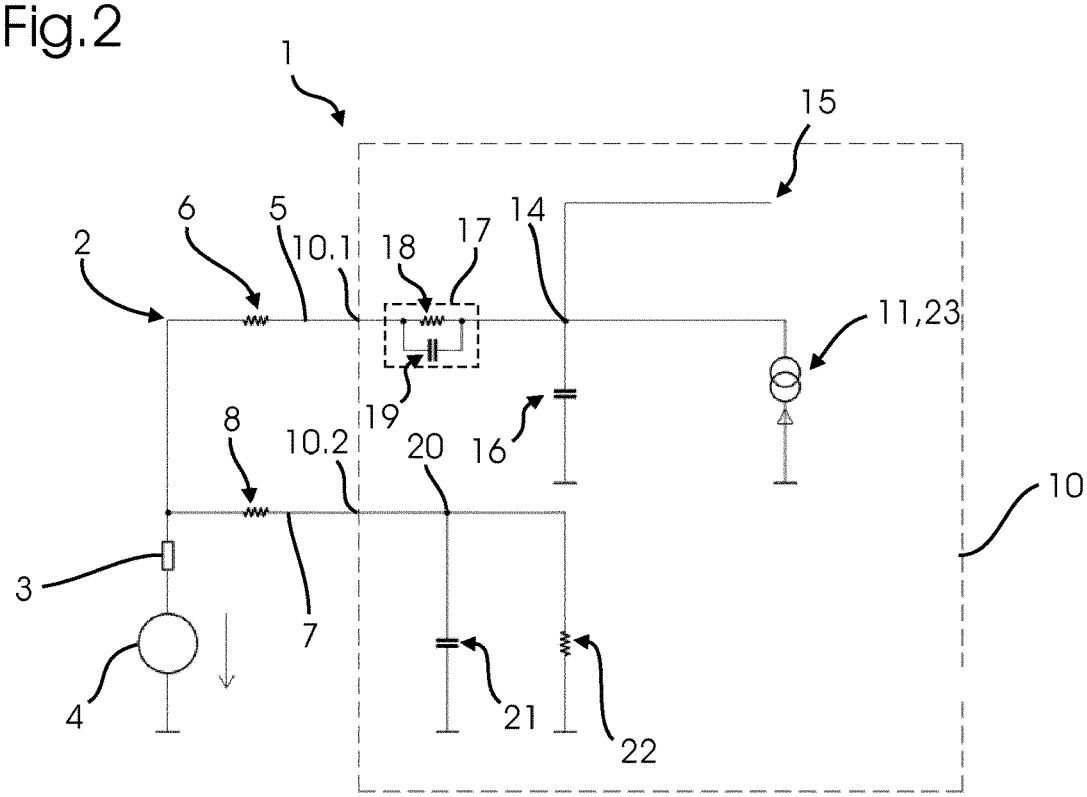
FIG. 2 is a schematic view of a second embodiment of an inventive system.

FIG. 2 shows a second embodiment of an inventive system 1, which is largely identical to the embodiment shown in FIG. 1 and therefore will not be explained in detail again. However, the first impedance element 13 has been omitted and the first electric source 11 is a DC or AC current source 23 of known output current level. All measurements described for the system 1 in FIG. 1 can be applied in the same manner to the system 1 in FIG. 2 by setting the appropriate current level and AC or DC operation mode of current source 23.

Figure 3:
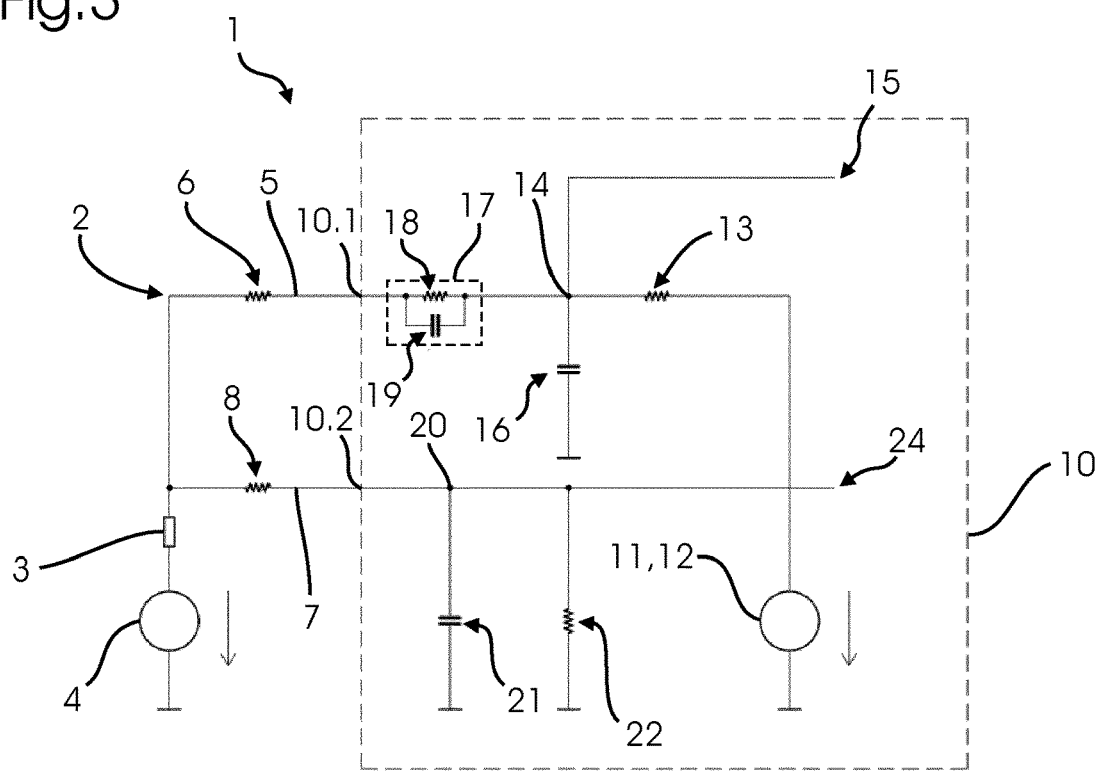
FIG. 3 is a schematic view of a third embodiment of an inventive system.

FIG. 3 shows a third embodiment of an inventive system 1, which is largely identical to the embodiment shown in FIG. 1. However, the second node 20 is connected to a second output 24, which may be e.g. connected to the same microcontroller as the first output 15. According to this embodiment, no sequential DC measurements are required. The first voltage source 12 applies a DC voltage, and the voltage difference between the first and second output 15, 24 is measured and evaluated. If the voltage difference is below a predetermined threshold, the connections between the circuit ports 10.1, 10.2 and frame 2 are deemed to be intact. Similar to the second embodiment in FIG. 2, the first voltage source 12 could be replaced by a current source 23 and first impedance element 13 could be omitted.

Figure 4:
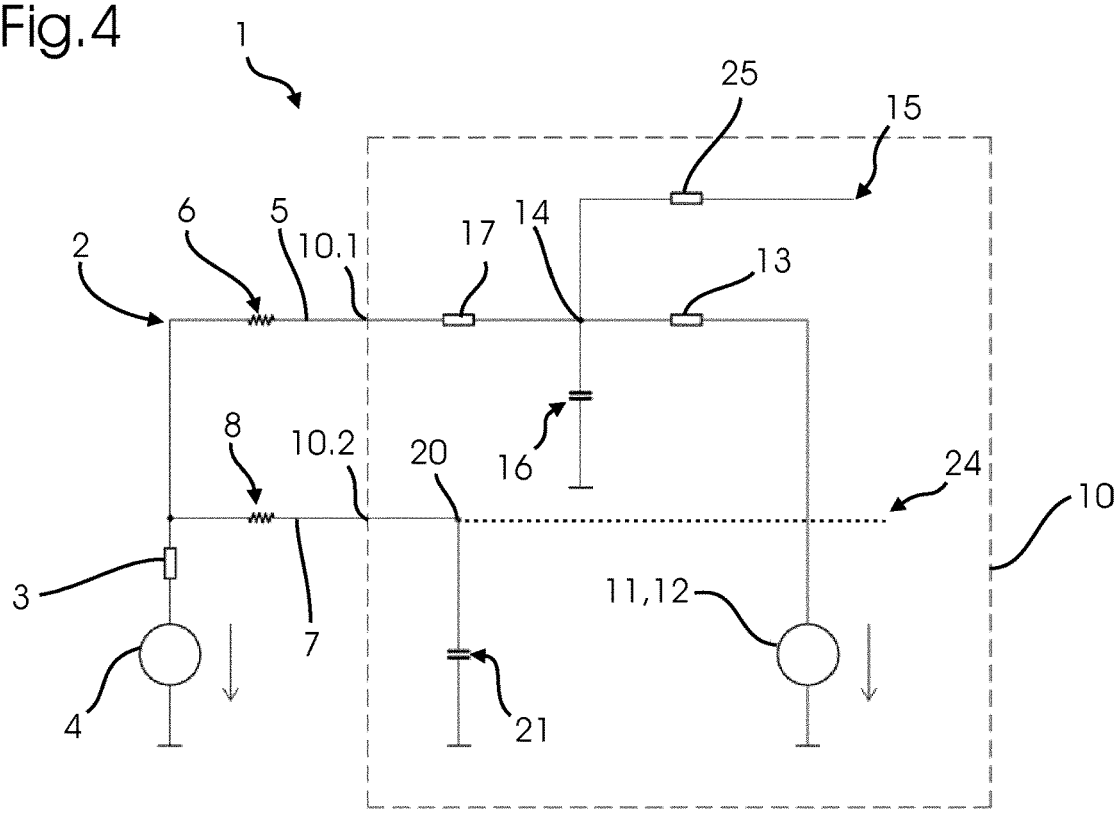
FIG. 4 is a schematic view of a fourth embodiment of an inventive system.

FIG. 4 shows a fourth embodiment of an inventive system 1, which again is largely similar to the embodiment shown in FIG. 1. However, this embodiment is designed for a situation where a no DC current may be injected into the frame 2, and where the external connection between frame and ground is undefined (present, absent or not known). In order to prevent any DC current flowing between the frame 2 and ground, the first and second impedance element 13, 17 are either purely capacitive or a series connection of a capacitance and a resistance. The same applies to a third impedance element by which the first output 15 is connected to the first node 14. Also, the DC ground connection via the second resistor 22 has been eliminated. In this embodiment, the first voltage source 12 of course has to be an AC voltage source. In this embodiment, the first voltage source 12 could be replaced by a current source and the first impedance element 13 could be omitted. The AC grounding and diagnostics is similar to the embodiment of FIG. 1, except that an AC only path exists between the frame 2 and ground. Here, too, it would be possible to connect the second node 20 to the second output 24 in order to perform a difference measurement of two voltages.

Each of the embodiments shown in FIGS. 1 to 4 can be simplified for the case that the frame 2 is already connected in a defined way to ground externally, via the impedance 3. In this case, the third capacitor 21 and the second resistor 22 can be omitted.

Figure 5:
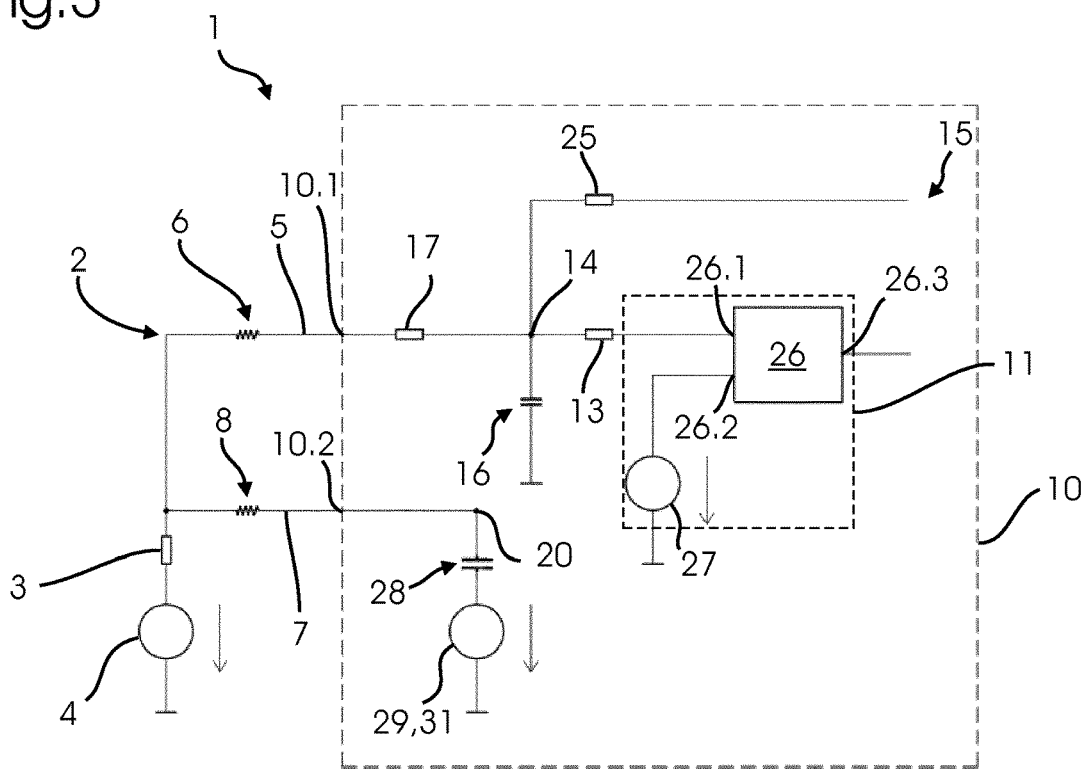
FIG. 5 is a schematic view of a fifth embodiment of an inventive system.

FIG. 5 shows another embodiment of an inventive system 1 for a situation where a DC current is not allowed to be injected into the frame 2, and where the external connection between frame 2 and ground is undefined (present, absent or not known). Here again, the first, second and third impedance element 13, 17, 25 are chosen so that an AC only path exists between the first circuit port 10.1 and ground. The diagnostics circuit 10 comprises a first transimpedance amplifier 26 having a signal input 26.1, a reference input 26.2 and an output 26.3. The signal input 26.1 is connected via the first impedance element 13 to the first node 14 while the reference input 26.2 is connected to a second voltage source 27. The second line 7 is connected to a third voltage source 29, which more generally can be regarded as a second electric source 31, via a fourth capacitor 28. Optionally, the third voltage source 29 can be the guard voltage source of a capacitive loading mode measurement circuit, and the fourth capacitor 28 can be the capacitance between a guard electrode and the frame 2. In this case, second wiring resistance 8 has 0 Ohms.

In a first step, the third voltage source 29 generates an AC voltage, and the second voltage source 27 is deactivated. A current flows through the fourth capacitor 28, the second wiring resistance 8, the first wiring resistance 6, the second impedance element 17, and the first impedance element 13 into the signal input 26.1 of the first transimpedance amplifier 26 and generates a corresponding output voltage on the output 26.3. If there is a break in the connection between the first circuit port 10.1 and frame 2, no current flows into the first transimpedance amplifier 26 and there is no output voltage on the output 26.3, which can be used as a criteria to output an error signal or the like. Another cause for a negligible current into the signal input 26.1 may however also be that the ground impedance 3 is so low that substantially all the current provided by third voltage source 29 flows into ground. Therefore, a second measurement step is performed. The second voltage source 27 is switched on and generates an AC signal with a frequency which is preferably different from the capacitive measurement frequency (and thereby from the signal of the third voltage source 29, if this is the guard voltage source). Thereby, the first transimpedance amplifier 26 helps keeping the frame 2 at AC ground for the capacitive measurement frequency. Alternatively, if the frequency is the same, the third voltage source 29 must be temporarily switched off, which also interrupts the capacitive measurement. Since the voltage at the signal input 26.1 follows the voltage of the reference input 26.2, it is substantially defined by the second voltage source 27. Therefore, the current flowing through the reference input 26.2, and thereby the voltage on the output 26.3, is indicative of the current flowing through the first wiring resistance 6. Therefore, a potential interruption can be inferred from the voltage level of output 26.3. The first output 15 is optional in this embodiment and allows the detection of a direct short of the first capacitor 16, as in the embodiments of FIGS. 1 to 4. One can also say that in this embodiment, the first electric source 11 applies a first diagnose signal to the frame 2, while the second electric source 31 applies a second diagnose signal.

The embodiment of FIG. 5 can be simplified for the case where the frame 2 is already connected in a defined way to ground externally via the ground impedance 3. In this case, the fourth capacitor 28 and the third voltage source 29 can be omitted.

Figure 6:
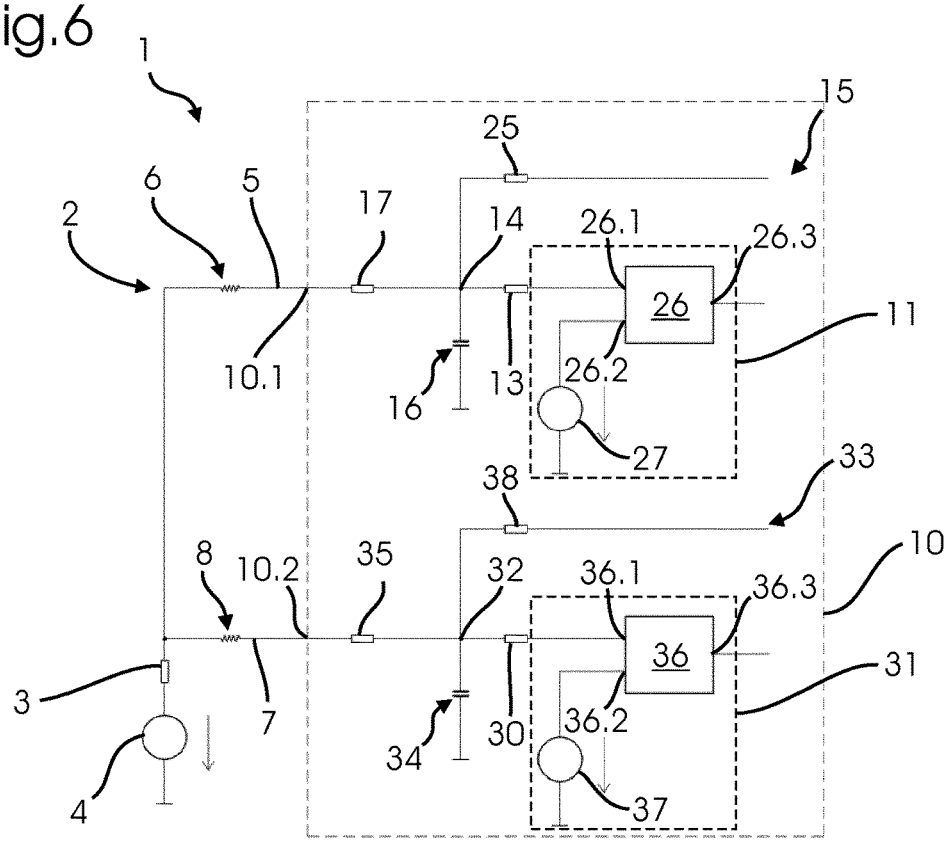
FIG. 6 is a schematic view of a sixth embodiment of an inventive system.

FIG. 6 shows an embodiment which allows the exact measurement of the wiring resistances 6 and 8, and the ground impedance 3. Regarding the components connected to the first line 5, this embodiment is identical to the embodiment shown in FIG. 5. However, a signal input 36.1 of a second transimpedance amplifier 36 is connected via a fourth impedance element 30 to a third node 32 which in turn is connected via a fifth impedance element 35 to the second line 7. Like the first node 14, the second node 32 is AC grounded via a fifth capacitor 34 and is connected to a third output 33 via a sixth impedance element 38. The reference input 36.2 of the second transimpedance amplifier 36 is connected to a fourth voltage source 37. The second transimpedance amplifier 36 and the fourth voltage source may be considered as parts of a second electric source 31. The first and the fourth voltage source 27, 37 each generate AC voltages with a frequency which is different from the capacitive measurement frequency. This allows the transimpedance amplifiers 26, 36 to help to keep the circuit ports 10.1, 10.2 at AC ground at the capacitive measurement frequency. If any of the frequencies of voltage sources 27, 37 is the same as the capacitive measurement frequency, the diagnostics and capacitive measurement cannot be performed at the same time.

By setting AC voltage sources 27, 37 to different levels, the wiring resistances 6, 8 and the ground impedance 3 can be determined by applying the methods described in WO 1999/059003 A1 or WO 2000/048010 A1, respectively.

Figure 7:
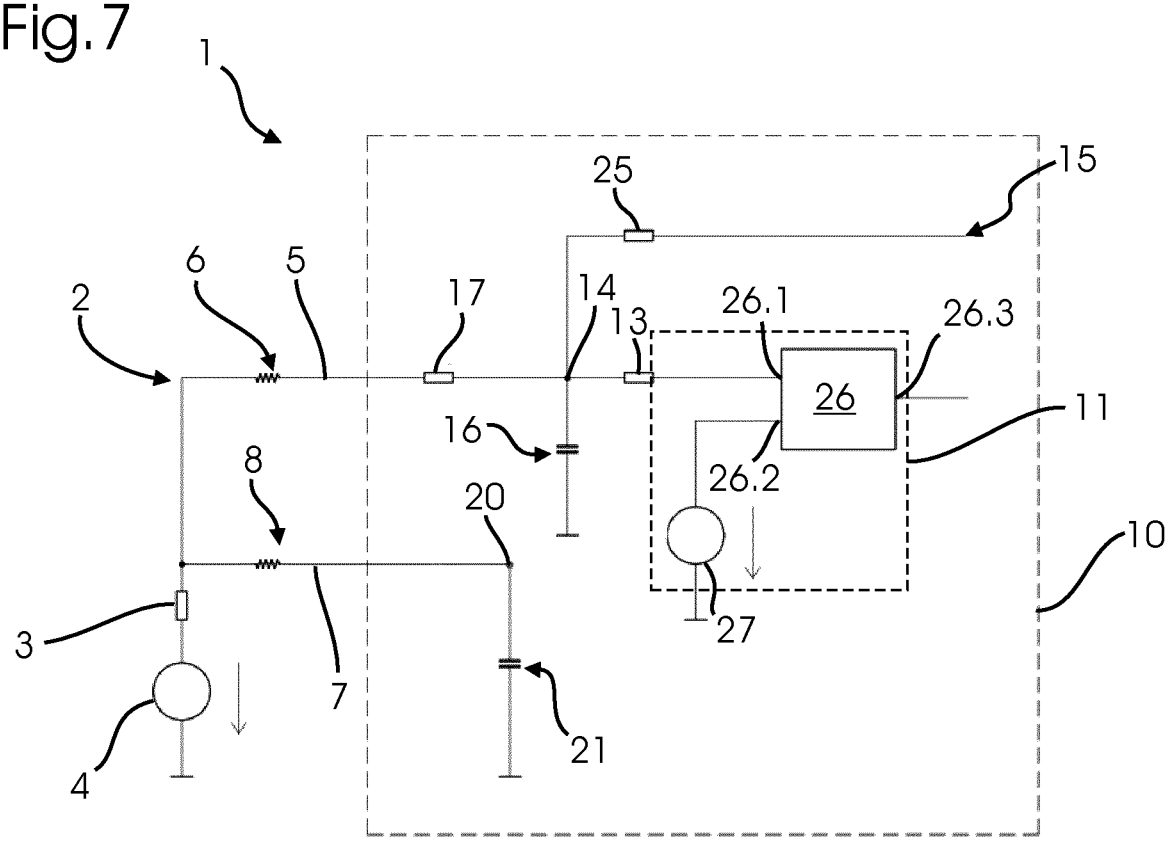
FIG. 7 is a schematic view of a seventh embodiment of an inventive system.

FIG. 7 shows a seventh embodiment of an inventive system 1, which may be regarded as a combination of the embodiments of FIG. 1 and FIG. 5. The second voltage source 27 generates an AC voltage on the signal input 26.1 of transimpedance amplifier 26. Similar to the embodiment in FIG. 1, the output voltage of output 26.3 is indicative of the equivalent series impedance of a Thévenin equivalent circuit as described for the embodiment in FIG. 1.

The invention claimed is:
1. A system for grounding and diagnostics, comprising:
   a conductive frame for mounting a capacitive sensor, the conductive frame being a vehicle seat frame or a steering wheel rim; and
   a diagnostics circuit, by which the frame is AC grounded and which comprises an electric source connected to the frame via a first line and adapted to apply a diagnose signal to the frame via the first line, the diagnostics circuit being connected to the frame by a second line and being adapted to provide at least one quantity that depends on the diagnose signal and on a ground connection of the frame.

2. A system according to claim 1, wherein the frame is AC grounded via at least one of the first line and the second line.

3. A system according to claim 1, wherein the diagnostics circuit is adapted to provide at least one quantity that enables determination of at least one of a ground impedance or a ground shift voltage that the frame has with respect to ground.

4. A system according to claim 1, wherein the electric source is a first voltage source or a current source.

5. A system according to claim 1, wherein the electric source is connected to the first line via a first impedance element.

6. A system according to claim 1, wherein the diagnostics circuit comprises a second electric source, which is connected to the frame via the second line.

7. A system according to claim 1, wherein the electric source is connected to the first line via a first node, which is AC grounded.

8. A system according to claim 7, wherein a second impedance element is connected between the first node and the first line.

9. A system according to claim 7, wherein the diagnostics circuit is adapted to provide a first voltage of a first output, which is connected to the first node.

10. A system according to claim 9, wherein the first output is connected to the first node via a third impedance element.

11. A system according to claim 7, wherein the electric source is a first electric source that includes a first transimpedance amplifier having a reference input connected to a second voltage source and a signal input connected to the first node.

12. A system according to claim 11, wherein the second line is connected to a third voltage source via a capacitance element.

13. A system according to claim 11, wherein the diagnostics circuit comprises a second transimpedance amplifier having a reference input connected to a fourth voltage source and a signal input connected to a third node that is AC grounded and connected to the second line and that the diagnostics circuit is adapted to provide a third voltage of a third output connected to the third node.

14. A system according to claim 1, wherein the second line is connected to a second node, which is at least AC grounded.

15. A system according to claim 14, wherein the diagnostics circuit is adapted to measure a difference between the first voltage and a second voltage of a second output connected to the second node.

16. A diagnostics circuit for a conductive frame for mounting a capacitive sensor, wherein the conductive frame is a vehicle seat frame or a steering wheel rim, and the diagnostic circuit is adapted for AC grounding the frame and comprises an electric source adapted for being connected to the frame via a first line and to apply a diagnose signal to the frame via the first line, the diagnostics circuit being adapted for being connected to the frame by a second line and being adapted to provide at least one quantity that depends on the diagnose signal and on a ground connection of the frame.

* * * * *